United States Patent
Fertl et al.

(10) Patent No.: US 9,824,833 B2
(45) Date of Patent: Nov. 21, 2017

(54) APPLIANCE COMPRISING AN OPERATING UNIT

(75) Inventors: Daniela Fertl, München (DE); Fritjof Kaiser, Neubiberg (DE); Ines Steinke, München (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 925 days.

(21) Appl. No.: 13/879,461

(22) PCT Filed: Oct. 14, 2011

(86) PCT No.: PCT/EP2011/067979
§ 371 (c)(1),
(2), (4) Date: Jul. 3, 2013

(87) PCT Pub. No.: WO2012/049288
PCT Pub. Date: Apr. 19, 2012

(65) Prior Publication Data
US 2013/0284570 A1    Oct. 31, 2013

(30) Foreign Application Priority Data
Oct. 15, 2010   (DE) .................. 10 2010 042 524

(51) Int. Cl.
*G04G 21/08*   (2010.01)
*H01H 9/20*    (2006.01)
*H03K 17/96*   (2006.01)

(52) U.S. Cl.
CPC .............. *H01H 9/20* (2013.01); *G04G 21/08* (2013.01); *H03K 17/9645* (2013.01); *H01H 2239/078* (2013.01)

(58) Field of Classification Search
CPC .............. H01H 9/20; H01H 2239/078; H03K 17/9645; G04G 21/08
See application file for complete search history.

(56) References Cited

U.S. PATENT DOCUMENTS 4,093,992 A    6/1978   Kawamura et al.
6,052,339 A *  4/2000   Frenkel et al. ............... 368/230
(Continued)

FOREIGN PATENT DOCUMENTS

CH    626498    11/1981
DE    3839655    4/1989
(Continued)

OTHER PUBLICATIONS

German Office Action for German Priority Patent Application No. 10 2010 042 524.9, dated Feb. 1, 2011.
(Continued)

*Primary Examiner* — Amare Mengistu
*Assistant Examiner* — Amy C Onyekaba
(74) *Attorney, Agent, or Firm* — Slayden Grubert Beard PLLC

(57) ABSTRACT

An appliance has an operating unit with an actuating element for triggering a pre-determined action. The actuating element is mechanically actuatable by force of a user. The actuating element is preferably a mechanically actuatable switch and/or key element. A touch-sensitive sensor is built into the actuating element, for detecting skin contact occurring as a result of the exertion of force for the mechanical actuation of the actuating element. The appliance is also embodied in such a way that, as a requirement for triggering the pre-determined actions, it is checked whether the actuating element is actuated and skin contact is detected by the touch-sensitive sensor. The appliance prevents defective actuations by associating touch-sensitive sensor technology with the mechanically actuatable actuating element. This ensures that mechanical actuation without skin contact does trigger the pre-determined action.

15 Claims, 1 Drawing Sheet

(56) References Cited

U.S. PATENT DOCUMENTS

| | | | |
|---|---|---|---|
| 7,031,228 B2* | 4/2006 | Born et al. | 368/69 |
| 8,059,491 B1* | 11/2011 | Hennings-Kampa | 368/14 |
| 2008/0001735 A1* | 1/2008 | Tran | 340/539.22 |
| 2008/0238667 A1* | 10/2008 | Olson | 340/541 |
| 2009/0059730 A1* | 3/2009 | Lyons et al. | 368/69 |
| 2010/0177599 A1* | 7/2010 | Pan | 368/11 |
| 2010/0302122 A1* | 12/2010 | Soler Castany et al. | 343/848 |
| 2010/0309000 A1* | 12/2010 | Munthe-Kaas et al. | 340/573.1 |
| 2011/0003665 A1* | 1/2011 | Burton et al. | 482/9 |

FOREIGN PATENT DOCUMENTS

| | | |
|---|---|---|
| DE | 19839550 | 3/2000 |
| DE | 20103570 | 5/2001 |
| DE | 10200493 | 7/2003 |
| DE | 102010042524.9 | 10/2010 |
| EP | 2178098 | 4/2010 |
| GB | 2046445 | 11/1980 |
| WO | PCT/EP2011/067979 | 10/2011 |

OTHER PUBLICATIONS

International Search Report for PCT/EP2011/067979, dated Mar. 5, 2012.

* cited by examiner

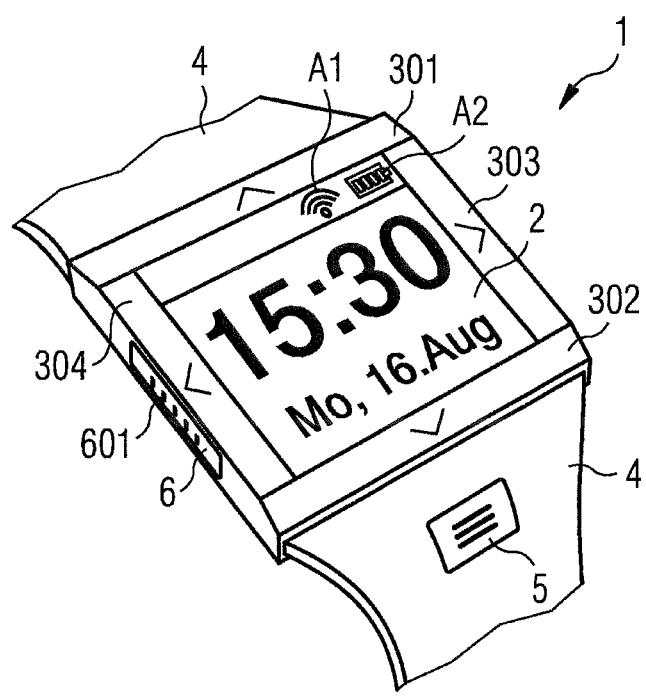

APPLIANCE COMPRISING AN OPERATING UNIT

CROSS REFERENCE TO RELATED APPLICATIONS

This application is based on and hereby claims priority to International Application No. PCT/EP2011/067979 filed on Oct. 14, 2011 and German Application No. 10 2010 042 524.9 filed on Oct. 15, 2010, the contents of which are hereby incorporated by reference.

BACKGROUND

The invention relates to an appliance comprising an operating unit.

Various appliances are known from the related art, such as watches or mobile phones, having a mechanically-actuatable actuation element which can be actuated by the user, after which a pre-determined action is triggered. The appliances are used by senior citizens or other persons requiring assistance for example, in order to actuate the actuation element if need be, and in doing so, send an emergency call to a central control center. The emergency call is transferred in such cases via a corresponding communication interface of the appliance to the central control center, which can then locate the appliance with a suitable method (e.g. GPS) and provide assistance.

Appliances which include the actuation element described above are either not protected at all or at least only partly protected from an unintentional activation of the actuation element. A known approach with such appliances is to recess the mechanically-actuatable actuation element into the housing of the appliance, so that the likelihood of an unintentional actuation is at least reduced. Another known approach is to embody the actuation element so that it can only be mechanically actuated by applying increased force. Nonetheless there is still the risk of a specific mechanical influence actuating the actuation element unintentionally and thus of an emergency call or a pre-determined action being triggered.

SUMMARY

One potential object is therefore to create an appliance with an operating unit in which a mechanically-actuatable operating element can be very well protected against unwanted triggering of a pre-determined action.

The inventors propose an appliance comprises an operating unit which comprises an actuation element for initiating a pre-determined action, wherein the actuation element is able to be actuated by a user exerting a force. The actuation element in this case contains a touch-sensitive sensor for the detection of skin contact which occurs as a result of the force for mechanical actuation of the actuation element being exerted. Furthermore the appliance is embodied such that a check is made, as a requirement for the triggering of the pre-determined action, as to whether the actuation element is being actuated and skin contact is detected by the touch-sensitive sensor within the framework of the mechanical actuation. This means that, as well as the mechanical actuation of the actuation element, a necessary criterion for the triggering of the pre-determined action is appropriate skin contact being detected by the sensor.

The appliance is based on the knowledge that, by a suitable coupling of the non-contact sensor technology known per se with a mechanically-actuatable actuation element, an efficient protection from undesired triggering of a pre-determined action, such as an alarm or emergency function for example, can be achieved. The sensing of skin contact ensures that the actuation element is not inadvertently actuated with other objects. Only if it can be assumed that the user is mechanically actuating the actuation element with his or her skin is the corresponding defined pre-determined action carried out. Any of the technologies known from the related art can be used as the technology for detection of the skin contact. In particular the skin contact can be detected by sensing the electrical resistance of human skin.

The proposed actuation element can be embodied in any given way. In an especially preferred embodiment the actuation element comprises a switch and/or button element with an actuation surface, on which the force is exerted during the mechanical actuation of the actuation element, wherein the touch-sensitive sensor is integrated into the actuation surface such that the sensor detects skin contact with the actuation surface. The switch and/or button element can be actuatable in any given way, especially by pressure and/or tension. For example the switch and/or button element can be embodied as a push button.

In order to make it possible for example for the user to find the actuation element quickly in an emergency situation, the actuation surface is preferably embodied as an actuation element embodied as a switch and/or button element such that it can be distinguished by touch by a user from a housing of the appliance surrounding the actuation surface. For example the actuation surface can be formed of a different material from the housing and/or have touch-detectable raised areas and/or recessed areas on the surface, especially raised dots and/or grooves and the like. To achieve enhanced protection from inadvertent actuation, in a further embodiment the actuation surface is disposed recessed on the housing of the appliance.

To further increase the protection from inadvertent triggering of the pre-determined action, the appliance is embodied in a further embodiment such that the pre-determined action is triggered if the actuation element is actuated for a predefined length of time and for the predefined length of time a (continuous) skin contact is also detected by the touch-sensitive sensor. In this way it is ensured that the pre-determined action will not be triggered by short, inadvertent mechanical actuation of the actuation element.

The pre-determined action which is triggered as a result of the mechanical actuation of the actuation element and the detection of skin contact by the touch-sensitive sensor can be embodied differently depending on the application. Preferably the pre-determined action comprises the activation of an alarm, in order e.g. to provide information about a situation critical to safety. The alarm can be embodied in different ways. For example optical alarms and/or acoustic sounds can be triggered. In a preferred variant, as part of the alarm via a communication interface of the appliance, especially a mobile radio interface, an emergency call or a message is transferred to a control center. In particular the appliance in this case is the appliance described at the start for senior citizens or people requiring help, which issues an emergency call in emergencies via the actuation element to a central control center.

In a further embodiment the appliance includes a display which interacts with the operating unit of the appliance, which enables many different functions and applications to be realized in the appliance. In a further embodiment an application is able to be executed on the appliance which monitors vital functions of the human body. This application is especially realized in the appliances described above for senior citizens or people who are ill, wherein, in the event of a failure or a deterioration of a vital function being established, an emergency call is triggered automatically. As part of the monitoring of vital functions the appliance interacts in such cases with corresponding sensors on the body of the user, which transfer vital signs such as e.g. blood pressure, pulse rate, body temperature to the appliance.

The appliance is preferably a portable appliance, especially a wrist appliance and/or a wristwatch and/or a mobile telephone which a user can easily carry with them. Nonetheless the proposed appliance is also able to be used in any other given area of application. In particular the appliance can also be a control unit which is used for example for a building or for an automation system for production or process automation or for an energy-producing and/or energy distribution system.

BRIEF DESCRIPTION OF THE DRAWINGS

These and other objects and advantages of the present invention will become more apparent and more readily appreciated from the following description of the preferred embodiments, taken in conjunction with the accompanying drawing of which:

FIG. 1 shows a perspective view of an embodiment of the proposed appliance in the form of a wristwatch.

DETAILED DESCRIPTION OF THE PREFERRED EMBODIMENT

Reference will now be made in detail to the preferred embodiments of the present invention, examples of which are illustrated in the accompanying drawing, wherein like reference numerals refer to like elements throughout.

The wristwatch shown in FIG. 1, which is identified by the reference character 1, represents what is known as a senior citizens' watch, which is especially used by older people or ill patients and contains corresponding functionalities to make it possible for older people, even with health problems, to live independently in a household without long-term care. In particular the watch provides the emergency call function explained below. Furthermore vital functions of the wearer can be monitored if necessary with the watch.

The watch of FIG. 1 comprises a large, easily-readable display 2 which is able to be attached to the wrist via a bracelet 4 and can be controlled intuitively and easily by corresponding actuation elements 301, 302, 303 and 304. The actuation elements are embodied here as touch-sensitive sensors and make possible a simple navigation in a menu tree or between different applications running on the watch. In the example of FIG. 1 the application for displaying the time (15:30) and the date (Monday, 16 August) are depicted on the display 2. The watch contains further applications which can be called up as a kind of scrolling (virtual) list. In this case the list can be scrolled through in an upwards direction using the actuation element 301 and scrolled through in a downwards direction using the actuation element 302. This means that, with each actuation of the actuation element 301 or 302, the list of the applications is scrolled through in a pre-determined direction and a new application is called up. The applications can be prioritized in such cases, i.e. more important applications directly adjoin the application shown for displaying the time and date and applications with lower priority follow further up or further down in the list. As well as the upper and lower actuation elements 301 and 302 the right actuation element 303 is used to call up corresponding detailed information of the application just displayed, wherein the left actuation element 304 can be used to return to the application.

As well as the display mode just described, based on a list of applications, a further display mode exists in the watch which can be called up via a further actuation element 5 which is integrated into the lower area of the bracelet 4 and is also embodied as a touch-sensitive sensor. The further display mode in this case presents the functionalities of the watch in the form of a menu tree with a plurality of hierarchy levels, wherein in this display mode, menu entries in the same hierarchy level can be scrolled through using the actuation elements 301 or 302 respectively and a switch can be made into a higher hierarchy level using the actuation elements 303 or 304. The wristwatch of FIG. 1 also has a mobile radio interface and is operated via a battery. In this case further symbols A1 and A2 are shown on the display 2. The symbol A1 shows the strength of the mobile signal reception and the symbol A2 shows the charge state of the battery.

Different applications can be called up on the display 2 of the watch 1, depending on how it is being used, e.g. an address book for contacts, an application for managing appointments and the like. The applications which are able to be called also include an application of the monitoring of vital functions of the human body, as has already been mentioned above. With such an application one or more vital signs of a patient, such as e.g. pulse rate, blood pressure, body temperature and the like can be monitored. If this application is running on the watch, the user wears corresponding sensors on his or her body with which the vital signs will be detected. In such cases the sensors and the wristwatch communicate via a wireless communication interface, so that the vital signs are transmitted wirelessly from the sensors to the wristwatch. The sensor data detected can then be read out during the next visit to the doctor and used for diagnosis. In particular however there is also the option that, on detection of a failure or a deterioration of vital functions, a corresponding emergency call is issued via the mobile radio interface to a medical control center, which can subsequently locate the wristwatch by localization of the mobile radio cell and send an emergency doctor to the patient.

The wristwatch of FIG. 1, in addition to the actuation elements already described, includes a further actuation element 6 provided on the left-hand side of the housing of the watch, which is a significant component of the wristwatch. The actuation element 6 is a mechanically-actuatable pushbutton embodied as a rectangle which additionally contains a touch-sensitive sensor which can detect contact between the touch surface of the actuation element and human skin. In this case any technologies known from the related art for detection of touches can be used. Since these technologies are known per se they will not be explained in any greater detail at this point. In a preferred variant the skin touching the actuation element is detected by capturing the resistance of human skin. A plurality of raised dots 601 are also provided on the surface of the actuation element, with which a user can detect the position of the actuation element by touch. In addition the actuation element 6 is also made of a different material from the rest of the housing. For example the housing can be made of metal while the material of the actuation element is soft plastic. This too facilitates the localization of the actuation element by touch.

The actuation element 6 enables a user to manually inform a central medical control center in an emergency situation, such as e.g. in the event of a poor state of health. To do this the user presses the mechanical actuation element 6, which he or she can also feel without visual contact with the watch because of the raised dots 601 and also the material of the element differing from that of the housing. In response to this action a corresponding emergency call is issued to the central control center via the mobile radio interface, which can then locate the wristwatch by localization of the mobile radio cell and can send a doctor to the patient or can inform relatives.

A particular feature of the watch is that an emergency call is only issued if, as well as the mechanical actuation of the actuation element 6, it is also established via the touch-sensitive sensor of the actuation element that the touch-sensitive surface of the actuation element has been touched by human skin. This enables it to be ensured in a simple manner that the emergency call has not been triggered inadvertently as a result of force acting on the actuation element from objects, such as clothing for example. To further enhance the protection against inadvertent actuation it might also be possible for an emergency call only to be issued after a pre-determined period of time. This means that only if the mechanical actuation of the actuation element and also the skin contact is maintained beyond the pre-determined period of time does this lead to the emergency call being issued. The period of time can be selected differently as a function of the application and preferably lies in the range of between 1 and 3 seconds.

The embodiment of the proposed appliance just described has a plurality of advantages. In particular the technology of a touch-sensitive sensor is coupled to a mechanical actuation and only if both the mechanical actuation of the actuation element and also the element being touched by human skin is detected is a corresponding emergency call triggered. By obtaining this extra information a significantly more differentiated distinction between unintentional operation and intended operation can be made. This enables unwanted alarms to be minimized. In such cases the appliance is not restricted to the wristwatch described in FIG. 1, but can also be used in any other given areas for appliances with a control unit. In particular the appliance can also be a control unit for a building or for an automation system or for an energy-producing and/or energy distribution system. For example industrial machines can be equipped with emergency call buttons similar to the actuation element 6 described above and placed in the immediate vicinity of the operating personnel. In such cases it is also possible for an emergency call or an alarm not to be triggered by way of the actuation element but for other actions to be put in train, such as e.g. safety-critical or irreversible processes in which it is important to exclude unintentional operating errors.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:

1. An appliance with an operating unit, comprising:
   an actuation element to trigger a pre-determined action, the actuation element being actuated by mechanical force of a user on the actuation element; and
   a touch-sensitive sensor provided for the actuation unit, to detect skin contact which occurs as a result of the mechanical force on the actuation element,
   wherein the appliance triggers the pre-determined action only if the actuation element has been actuated by the mechanical force of the user and the touch-sensitive sensor has detected skin contact during actuation of the actuation element, wherein
   the actuation element comprises a switch and/or button element with an actuation surface on which the mechanical force is exerted during actuation of the actuation element,
   the touch-sensitive sensor is integrated into the actuation surface such that the touch-sensitive sensor detects skin contact with the actuation surface,
   the switch and/or button element is actuated by pressure and/or tension, and
   the switch and/or button element comprises a pushbutton.

2. The appliance as claimed in claim 1, wherein
   the appliance has a housing,
   the actuation surface is provided on the housing, and
   the actuation surface is embodied such that it can be distinguished from the housing when touched by the user.

3. The appliance as claimed in claim 2, wherein
   the actuation surface is formed of a different material from the housing, and
   the different material can be detected when the actuation surface is touched by the user.

4. The appliance as claimed in claim 2, wherein
   the actuation surface has raised sections and/or recesses, and
   the raised sections and/or recesses can be detected when the actuation surface is touched by the user.

5. The appliance as claimed in claim 2, wherein
   the actuation surface has raised dots and/or grooves, and
   the raised dots and/or grooves can be detected when the actuation surface is touched by the user.

6. The appliance as claimed in claim 1, wherein
   the appliance has a housing, and
   the actuation surface is recessed into the housing.

7. The appliance as claimed in claim 1, wherein the appliance triggers the pre-determined action only if the actuation element has been actuated for a pre-determined period of time and the touch-sensitive sensor has detected skin contact for the pre-determined period of time.

8. The appliance as claimed in claim 1, wherein the touch-sensitive sensor detects skin contact by measuring skin resistance.

9. The appliance as claimed in claim 1, wherein the pre-determined action comprises activation of an alarm.

10. The appliance as claimed in claim 9, wherein
    the appliance further comprises a mobile radio interface, and
    activation of the alarm comprises transferring an emergency call or a message to a central control center via the mobile radio interface.

11. The appliance as claimed in claim 1, wherein the appliance includes a display which interacts with the operating unit.

12. The appliance as claimed in claim 1, wherein the appliance monitors vital human body functions of the user.

13. The appliance as claimed in claim 1, wherein the appliance is a wearable appliance.

14. The appliance as claimed in claim 13, wherein the wearable appliance is selected from the group consisting of a bracelet appliance, a wristwatch and a mobile telephone.

15. The appliance as claimed in claim 1, wherein the appliance is a control unit for a building, an automation system, an energy-producing system and/or an energy distribution system.

\* \* \* \* \*